United States Patent
King

(10) Patent No.: US 6,724,655 B2
(45) Date of Patent: Apr. 20, 2004

(54) MEMORY CELL USING NEGATIVE DIFFERENTIAL RESISTANCE FIELD EFFECT TRANSISTORS

(75) Inventor: Tsu-Jae King, Fremont, CA (US)

(73) Assignee: Progressant Technologies, Inc., Fremont, CA (US)

( * ) Notice: Subject to any disclaimer, the term of this patent is extended or adjusted under 35 U.S.C. 154(b) by 178 days.

(21) Appl. No.: 10/029,077

(22) Filed: Dec. 21, 2001

(65) Prior Publication Data

US 2002/0054502 A1 May 9, 2002

Related U.S. Application Data

(63) Continuation-in-part of application No. 09/603,101, filed on Jun. 22, 2000, now Pat. No. 6,512,274, and a continuation-in-part of application No. 09/603,102, filed on Jun. 22, 2000, now Pat. No. 6,479,862, and a continuation-in-part of application No. 09/602,658, filed on Jun. 22, 2000, now Pat. No. 6,596,617.

(51) Int. Cl.[7] .............................................. G11C 11/00
(52) U.S. Cl. ....................... 365/159; 365/148; 257/183; 257/213; 326/135
(58) Field of Search ................................. 365/159, 148, 365/72; 257/183, 213; 326/135; 331/115

(56) References Cited

U.S. PATENT DOCUMENTS

| 3,588,736 A | 6/1971 | McGroddy |
|---|---|---|
| 3,974,486 A | 8/1976 | Curtis et al. |
| 4,047,974 A | 9/1977 | Harari |
| 4,143,393 A | 3/1979 | DiMaria et al. |
| 4,806,998 A | 2/1989 | Vinter et al. |
| 4,945,393 A | 7/1990 | Beltram et al. |
| 5,021,841 A | 6/1991 | Leburton et al. |
| 5,023,836 A | 6/1991 | Mori |
| 5,032,891 A | 7/1991 | Takagi et al. |
| 5,084,743 A | 1/1992 | Mishra et al. |
| 5,093,699 A | 3/1992 | Weichold et al. |
| 5,130,763 A | 7/1992 | Delhaye et al. |
| 5,162,880 A | 11/1992 | Hazama et al. |
| 5,189,499 A | 2/1993 | Izumi et al. |
| 5,357,134 A | 10/1994 | Shimoji |
| 5,390,145 A | 2/1995 | Nakasha et al. |
| 5,442,194 A | 8/1995 | Moise |
| 5,448,513 A | 9/1995 | Hu et al. |
| 5,455,432 A | 10/1995 | Hartsell et al. |
| 5,463,234 A | 10/1995 | Toriumi et al. |
| 5,477,169 A | 12/1995 | Shen et al. |
| 5,523,603 A | 6/1996 | Fishbein et al. |

(List continued on next page.)

FOREIGN PATENT DOCUMENTS

| EP | 0747940 A2 | 12/1996 |
|---|---|---|
| EP | 0747961 A2 | 12/1996 |
| EP | 0655788 B1 | 1/1998 |

(List continued on next page.)

OTHER PUBLICATIONS

Alejandro F. Gonzalez, et al., "Standard CMOS Implementation of a Multiple-Valued Logic Signed-Digit Adder Based on Negative Differential-Resistance Devices," Proceedings of the 30th IEEE International Symposium on Multiple-Valued Logic (ISMVL 2000), 6 pages.

(List continued on next page.)

Primary Examiner—Van Thu Nguyen
Assistant Examiner—Nam Nguyen
(74) Attorney, Agent, or Firm—J. Nicholas Gross

(57) ABSTRACT

A memory cell using both negative differential resistance (NDR) and conventional FETs is disclosed. A pair of NDR FETs are coupled in a latch configuration so that a data value passed by a transfer FET can be stored at a storage node. By exploiting an NDR characteristic, the memory cell can be implemented with fewer active devices. Moreover, an NDR FET can be manufactured using conventional MOS processing steps so that process integration issues are minimized as compared to conventional NDR techniques.

16 Claims, 3 Drawing Sheets

U.S. PATENT DOCUMENTS

| | | | |
|---|---|---|---|
| 5,543,652 | A | 8/1996 | Ikeda et al. |
| 5,606,177 | A | 2/1997 | Wallace et al. |
| 5,633,178 | A | 5/1997 | Kalnitsky |
| 5,689,458 | A | 11/1997 | Kuriyama |
| 5,698,997 | A | 12/1997 | Williamson, III et al. |
| 5,705,827 | A | 1/1998 | Baba et al. |
| 5,732,014 | A | 3/1998 | Forbes |
| 5,761,114 | A | 6/1998 | Bertin et al. |
| 5,770,958 | A | 6/1998 | Arai et al. |
| 5,773,996 | A | 6/1998 | Takao |
| 5,798,965 | A | 8/1998 | Jun |
| 5,804,475 | A | 9/1998 | Meyer et al. |
| 5,843,812 | A | 12/1998 | Hwang |
| 5,869,845 | A | 2/1999 | Van der Wagt et al. |
| 5,883,549 | A | 3/1999 | De Los Santos |
| 5,883,829 | A | 3/1999 | Van der Wagt |
| 5,895,934 | A | 4/1999 | Harvey et al. |
| 5,903,170 | A | 5/1999 | Kulkarni et al. |
| 5,907,159 | A | 5/1999 | Roh et al. |
| 5,936,265 | A | 8/1999 | Koga |
| 5,942,952 | A * | 8/1999 | Nair et al. .................. 331/115 |
| 5,945,706 | A | 8/1999 | Jun |
| 5,953,249 | A | 9/1999 | Van der Wagt |
| 5,959,328 | A | 9/1999 | Krautschneider et al. |
| 5,962,864 | A | 10/1999 | Leadbeater et al. |
| 6,015,739 | A | 1/2000 | Gardner et al. |
| 6,015,978 | A | 1/2000 | Yuki et al. |
| 6,075,265 | A | 6/2000 | Goebel et al. |
| 6,077,760 | A | 6/2000 | Fang et al. |
| 6,084,796 | A | 7/2000 | Kozicki et al. |
| 6,091,077 | A | 7/2000 | Morita et al. |
| 6,097,036 | A | 8/2000 | Teshima et al. |
| 6,104,631 | A | 8/2000 | El-Sharawy et al. |
| 6,128,216 | A | 10/2000 | Noble, Jr. et al. |
| 6,130,559 | A | 10/2000 | Balsara et al. |
| 6,150,242 | A | 11/2000 | Van der Wagt et al. |
| 6,184,539 | B1 | 2/2001 | Wu et al. |
| 6,205,054 | B1 | 3/2001 | Inami |
| 6,222,766 | B1 | 4/2001 | Sasaki et al. |
| 6,225,165 | B1 | 5/2001 | Noble, Jr. et al. |
| 6,246,606 | B1 | 6/2001 | Forbes et al. |
| 6,261,896 | B1 | 7/2001 | Jun |
| 6,294,412 | B1 | 9/2001 | Krivokapic |
| 6,301,147 | B1 | 10/2001 | El-Sharawy et al. |
| 6,303,942 | B1 | 10/2001 | Farmer |
| 6,310,799 | B2 | 10/2001 | Duane et al. |
| 6,316,965 | B1 * | 11/2001 | Jonker et al. ............... 326/134 |
| 6,396,731 | B1 | 5/2002 | Chou |
| 6,404,018 | B1 | 6/2002 | Wu et al. |
| 2001/0005327 | A1 | 6/2001 | Duane et al. |
| 2001/0013621 | A1 | 8/2001 | Nakazato |
| 2001/0019137 | A1 | 9/2001 | Koga et al. |
| 2001/0024841 | A1 | 9/2001 | Noble, Jr. et al. |
| 2001/0053568 | A1 | 12/2001 | Deboy et al. |
| 2002/0093030 | A1 | 7/2002 | Hsu et al. |
| 2002/0100918 | A1 | 8/2002 | Hsu et al. |
| 2002/0109150 | A1 | 8/2002 | Kajiyama |

FOREIGN PATENT DOCUMENTS

| | | |
|---|---|---|
| EP | 1050964 A2 | 11/2000 |
| EP | 1085656 A2 | 3/2001 |
| EP | 1107317 A1 | 6/2001 |
| EP | 0526897 B1 | 11/2001 |
| EP | 1168456 A2 | 1/2002 |
| EP | 1204146 A1 | 5/2002 |
| WO | WO 90/03646 | 4/1990 |
| WO | WO 9963598 | 4/1999 |
| WO | WO 00/41309 | 7/2000 |
| WO | WO 0041309 | 7/2000 |
| WO | WO 01/65597 A1 | 9/2001 |
| WO | WO 01/69607 A2 | 9/2001 |
| WO | WO 01/99153 A2 | 12/2001 |

OTHER PUBLICATIONS

Seabaugh A., Brar B., Broekaert T., Morris F., and Frazier G., "Resonant Tunneling Mixed Signal Circuit Technology," Solid–State Electronics 43:1355–1365, 1999.

G. Wirth, et al., "Negative Differential Resistance in Ultrashort Bulk MOSFETs," IECON'99 Conference Proceedings, vol. 1, San Jose, 1999, S. 29–34.

R. H. Mathews, et al., "A New RTD–FET Logic Family," Proceedings of the IEEE, vol. 87, No. 4, pp. 596–605, 1999.

J. P. A. Van Der Wagt, "Tunneling–Based SRAM," Proceedings of the IEEE, vol. 87, No. 4, pp. 571–595, 1999.

C. P. Heij, et al., "Negative Differential Resistance Due to Single–Electron Switching," Applied Physics Letters, vol. 74, No. 7, Feb. 15, 1999, 5 pages.

C. Pacha, et al., "Resonant Tunneling Device Logic Circuits," Microelectronics Advanced Research Initiative (MEL–ARI,) Jul. 1998–Jul. 1999, pp. 1–22.

A. Seabaugh, "Promise of Tunnel Diode Integrated Circuits," Tunnel Diode and CMOS/HBT Integration Workshop, Dec. 9, 1999, Naval Research Laboratory, Washington, DC., 13 pages.

Jian Fu Zhang, "Traps: Detrapping," Wiley Encyclopedia of Electrical and Electronics Engineering Online, Article Posting Date: Dec. 27, 1999, John Wiley & Sons, Inc., 4 pages.

Jian Fu Zhang, "Traps: Effects of Traps and Trapped Charges on Device Performance," Wiley Encyclopedia of Electrical and Electronics Engineering Online, Article Posting Date: Dec. 27, 1999, John Wiley & Sons, Inc., 2 pages.

Jian Fu Zhang, "Traps: Measurement Techniques," Wiley Encyclopedia of Electrical and Electronics Engineering Online, Article Posting Date: Dec. 27, 1999, John Wiley & Sons, Inc., 5 pages.

Jian Fu Zhang, "Traps," Wiley Encyclopedia of Electrical and Electronics Engineering Online, Article Posting Date: Dec. 27, 1999, John Wiley & Sons, Inc., 2 pages.

Jian Fu Zhang, "Traps: Trapping Kinetics," Wiley Encyclopedia of Electrical and Electronics Engineering Online, Article Posting Date: Dec. 27, 1999, John Wiley & Sons, Inc., 2 pages.

Jian Fu Zhang, "Traps: Origin of Traps," Wiley Encyclopedia of Electrical and Electronics Engineering Online, Article Posting Date: Dec. 27, 1999, John Wiley & Sons, Inc., 4 pages.

Gardner, Carl, Ringhofer, Christian, "Smooth Quantum Hydrodynamic Model Simulation of the Resonant Tunneling Diode," Dept. Of Mathematics Arizona State University, pp. 1–5, (1998).

Jungel, A, Pohl, C., "Numerical Simulation of Semiconductor Devices: Energy–Transport and Quantum Hydrodynamic Modeling," Fachbereich Math., Tech. Univ. Berlin, Germany, pp. 1–9, 1998.

S.M.A. Nimour, R. Ouasti, N. Zekri, "Effect of Spatially Disordered Barriers on the Band Structure of Finite Superlattices," phys. stat. sol. (b) 1998, 209, No. 2, 311–318.

S. L. Rommel, et al., "Room Temperature Operation of Epitaxially Grown Si/Si0.5Ge0.5/Si Resonant Interband Tunneling Diodes," Applied Physics Letters, vol. 73, No. 15, pp. 2191–2193, 1998.

News Release from www.eurekalert.org/releases/udel-udc-nflb.html, "UD Computer News: Future Looks Bright for Tunnel Diodes, Promising Faster, More Efficient Circuits," Oct. 1, 1998, 4 pages.

P. Mazumder, et al., "Digital Circuit Applications of Resonant Tunneling Devices," Proceedings of the IEEE, vol. 86, No. 4, pp. 664–686, Apr., 1998.

J. P. Sun, et al., "Resonant Tunneling Diodes: Models and Properties," Proceedings of the IEEE, vol. 86, No. 4, Apr. 1998, pp. 641–661.

J. P. A. Van Der Wagt, et al., "RTD/HFET Low Standby Power SRAM Gain Cell," Source: Corporate Research Laboratories, Texas Instruments, 1998, 4 pages.

C. Pacha and K. Goser, "Design of Arithmetic Circuits using Resonant Tunneling Diodes and Threshhold Logic," Lehrstuhl Bauelemente der Elektrotechnik, Universitat Dortmund, pp. 1–11, Sep. 1997.

G. I. Haddad et al., "Tunneling Devices and Applications in High Functionality/Speed Digital Circuits," Solid State Electronics, vol. 41, No. 10, Oct. 1997, pp. 1515–1524.

S. J. Koester, et al., "Negative Differential Conductance in Lateral Double–Barrier Transistors Fabricated in Strained Si Quantum Wells," Applied Physics Letters, vol. 70, No. 18, May, 1997, pp. 2422–2424.

Shao, Z., Porod, W., Lent, C., & Kirkner, D., "Transmission Zero Engineering in Lateral Double–Barrier Resonant Tunneling Devices," Dept. Of Electrical Engineering, University of Notre Dame, pp. 1–7 (1996).

E. Chan, et al., "Mask Programmable Multi–Valued Logic Gate Arrays Using RTDs and HBTs," IEE Proceedings–E: Computers and Digital Techniques, vol. 143, No. 5, Oct. 1996, pp. 289–294.

E. Chan, et al., "Compact Multiple–Valued Multiplexers Using Negative Differential Resistance Devices," IEEE Journal of Solid–State Circuits, vol. 31, No. 8, Aug. 1996, pp. 1151–1156.

S. Mohan, et al., "Ultrafast Pipelined Arithmetic Using Quantum Electronic Devices," IEE Proceedings–E: Computers and Digital Techniques, vol. 141, No. 2, Mar. 1994, pp, 104–110.

S. Luryi and M. Mastrapasqua, "Light–emitting Logic Devices based on Real Space Transfer in Complementary InGaAs/InAlAs Heterostructures", in "Negative Differential Resistance and Instabilities in 2D Semiconductors", ed. by N. Balkan, B. K. Ridley, and A. J. Vickers, NATO ASI Series [Physics] B 307, pp. 53–82, Plenum Press (New York 1993).

S. Mohan, et al., "Logic Design Based on Negative Differential Resistance Characteristics of Quantum Electronic Devices," IEE Proceedings–G: Electronic Devices, vol. 140, No. 6, Dec. 1993, pp. 383–391.

Serge Luryi and Mark Pinto, "Collector–Controlled States in Charge Injection Transistors," SPIE–92 Symposium, pp. 1–12, 1992.

Serge Luryi and Mark Pinto, "Collector–Controlled States and the Formation of Hot Electron Domains in Real–Space Transfer Transistors," AT&T Bell Laboratories, pp. 1–7, 1992.

S. Mohan, et al., "Ultrafast Pipelined Adders Using Resonant Tunneling Transistors," IEE Electronics Letters, vol. 27, No. 10, May 1991, pp. 830–831.

O. Le Neel, et al., "Electrical Transient Study of Negative Resistance in SOI MOS Transistors," Electronics Letters, vol. 26, No 1, pp. 73–74, Jan 1990.

P. S. Barlow, et al., "Negative differential output conductance of self–heated power MOSFETs," IEE Proceedings–I Solid–State and Electron Devices, vol. 133, part I, No. 5, Oct. 1986, pp. 177–179.

Farid Nemati et al., "A Novel High Density, Low Voltage SRAM Cell With a Vertical NDR Device," Center for Integrated Systems, Stanford University, CA, (2 pages).

Farid Nemati et al., "A Novel Thyristor–based SRAM Cell (T–RAM) for High–Speed, Low–Voltage, Giga–scale Memories," Center for Integrated Systems, Stanford University, CA, (4 pages).

Shoucair F. et al., "Analysis and Simulation of Simple Transistor Structures Exhibiting Negative Differential Resistance," EECS Department, UC Berkeley, Berkeley CA, (4 pages).

R. Oberhuber, et al., "Tunnel–Devices with Negative Differential Resistivity Based on Silicon?," Source: Deutsche Forschungsgemeinschaft and Siemens AG, date unknown, 2 pages.

Zhang, J.F. et al., "Electron trap generation in thermally grown $SIO_2$ under Fowler–Nordheim stress," J. Appl. Phys. 71 (2), Jan. 15, 1992, pp. 725–734.

Zhang, J.F. et al., "A quantitative investigation of electron detrapping in $SiO_2$ under Fowler–Nordheim stress," J. Appl. Phys. 71 (12), Jun. 15, 1992, pp. 5989–5996.

Zhang, J.F. et al., "A comparative study of the electron trapping and thermal detrapping in $SiO_2$ prepared by plasma and thermal oxidation," J. Appl. Phys. 72 (4), Aug. 15, 1992, pp. 1429–1435.

Scoffield, John H. et al., "Reconciliation of different gate–voltage dependencies of $1/f$ noise in n–MOS and p–MOS transistors," IEEE Trans. Electron. Dev. 41 (11), 11 pages.

Goldhaber–Gordon, David et al., "Overview of nanoelectronic devices," Proc. IEEE, 85(4), Apr. 1997, pp. 521–540.

Dozsa, L., et al., "A transient method for measuring current–voltage characteristics with negative differential resistance regions," Research Institute for Technical Physics, P. O. Box 76, H–1325 Budapest, Hungary, (Received Jul. 24, 1997; accepted Aug. 1, 1997), 2 pages.

Hong, J.W. et al, "Local charge trapping and detection of trapped charge by scanning capacitance microscope in $SiO_2/Si$ system," Appl. Phys. Lett., 75 (12), Sept. 20, 1999, pp. 1760–1762.

Wirth, G. et al., "Periodic transconductance oscillations in sub–100nm MOSFETs," ESSDERC'97 27th European Solid–State Device Research Conference, Stuttgart, Sep. 22–24, 1997, 4 pages.

Hansch, W. et al., "The planar–doped–barrier–FET: MOSFET overcomes conventional limitations," ESSDERC'97 27th European Solid–State Device Research Conference, Stuttgart, Sep. 22–24, 1997, 4 pages.

Haddab, Y. et al., "Quantized current jumps in silicon photoconductors at room temperature," J. Appl. Phys. 86 (7), Oct. 1, 1999, pp. 3787–3791.

Karna, Shashi P. et al., "Point defects in SI–SIO2 systems: current understanding," Published in G. Pacchioni et al. (eds.), "Defects in $SiO_2$ and related dielectrics: science and technology," Kluwer Academic Publishers, p. 599–615, (2000), 19 pages.

King, Tsu–Jae et al., Ser. No. 09/602,658, entitled "CMOS Compatible Process for Making a Tunable Negative Differential Resistance (NDR) Device," filed Jun. 22, 2000, 33 pages.*

King, Tsu–Jae et al., Ser. No. 09/603,101, entitled "CMOS–Process Compatible, Tunable NDR (Negative Differential Resistance) Device and Method of Operating Same," filed Jun. 22, 2000, 34 pages.*

King, Tsu–Jae et al., Ser. No. 09/603,102, entitled "Charge Trapping Device and Method for Implementing a Transistor having a Negative Differential Resistance Mode," filed Jun. 22, 2000, 39 pages.*

Geppert, Linda, "Quantum transistors: toward nanoelectronics," IEEE Spectrum, Sep. 2000, pp. 46–51.*

Villa, S. et al., "Application of 1/f noise measurements to the characterization of near–interface oxide states in ULSI n–MOSFET's," Dipartimento di Elettronica e Informazione, Politecnico di Milano (Italy), 7 pages.*

Final Report: SMILE MEL–ARI Project n°28741—Chapter V, pp. 184–194.*

Seabaugh, A. et al., "Tunnel–Diode IC," Minneapolis, Oct. 2, 2001, 23 pages.*

Deen, Jamal (editor) et al., excerpt from "CMOS RF modeling, characterization and applications," World Scientific, Apr. 2002, 34 pages.*

* cited by examiner

MEMORY CELL USING NEGATIVE DIFFERENTIAL RESISTANCE FIELD EFFECT TRANSISTORS

CROSS REFERENCE TO RELATED APPLICATIONS

The present application is a continuation-in-part of each of the following applications, all of which were filed Jun. 22, 2000 and are hereby incorporated by reference as if fully set forth herein:

Ser. No. 09/603,101 entitled "A CMOS-PRECOESS COMPATIBLE, TUNABLE NDR (NEGATIVE DIFFERENTIAL RESISTANCE) DEVICE AND METHOD OF OPERATING SAME" now U.S. Pat. No. 6,512,274; and Ser. No. 09/603,102 entitled "CHARGE TRAPPING DEVICE AND METOH FOR IMPLEMENTING A TRANSISTOR HAVING A NEGATIVE DIFFERENTIAL RESISTANCE MODE" now U.S. Pat. No. 6,479,862; and Ser. No. 09/602,658 entitled "CMOS COMPATIBLE PROCESS FOR MAKING A TUNABLE NEGATIVE DIFFERENCTIAL RESISTANCE (NDR) DEVICE" now U.S. Pat. No. 6,596,617.

FIELD OF THE INVENTION

This invention generally relates to semiconductor memory devices and technology, and in particular to static random access memory (SRAM) devices.

BACKGROUND OF THE INVENTION

The rapid growth of the semiconductor industry over the past three decades has largely been enabled by continual advancements in manufacturing technology which have allowed the size of the transistor, the basic building block in integrated circuits (ICs), to be steadily reduced with each new generation of technology. As the transistor size is scaled down, the chip area required for a given circuit is reduced, so that more chips can be manufactured on a single silicon wafer substrate, resulting in lower manufacturing cost per chip; circuit operation speed also improves, because of reduced capacitance and higher transistor current density. State-of-the-art fabrication facilities presently manufacture ICs with minimum transistor feature size smaller than 100 nm, so that microprocessor products with transistor counts approaching 100 million transistors per chip can be manufactured cost-effectively. High-density semiconductor memory devices have already reached the gigabit scale, led by dynamic random access memory (DRAM) technology. The DRAM memory cell consists of a single pass transistor and a capacitor (1T/1C), wherein information is stored in the form of charge on the capacitor. Although the DRAM cell provides the most compact layout (with area ranging between $4F^2$ and $8F^2$, where F is the minimum feature size), it requires frequent refreshing (typically on the order of once per millisecond) because the charge on the capacitor leaks away at a rate of approximately $10^{-15}$ Amperes per cell. This problem is exacerbated by technology scaling, because the transistor leakage current increases with decreasing channel length, and also because a reduction in cell capacitance results in a smaller number of stored charge carriers, so that more frequent refreshing is necessary. Thus, scaling of DRAM technology to much higher densities presents significant technological challenges.

Static RAM (SRAM) does not require refreshing and is generally faster than DRAM (approaching 1 ns access times as compared to tens of ns for DRAM). However, the SRAM cell is more complex, requiring either four n-channel metal-oxide-semiconductor field-effect transistors (MOSFETs) and two p-channel MOSFETs, or four n-channel MOSFETs and two polycrystalline-silicon (poly-Si) load resistors, resulting in significantly larger cell size (typically greater than >120 $F^2$). Innovations which provide significant reductions in SRAM cell size while allowing the SRAM cell to retain its favorable operating characteristics are therefore highly desirable.

Negative differential resistance (NDR) devices have previously been proposed for compact static memory applications. E. Goto in *IRE Trans. Electronic Computers*, March 1960, p. 25 disclosed an SRAM cell consisting of two resonant tunneling diodes (RTDs) and a pass transistor. For a variety of NDR devices including RTDs, the current first increases with increasing applied voltage, reaching a peak value, then decreases with increasing applied voltage over a range of applied voltages, exhibiting negative differential resistance over this range of applied voltages and reaching a minimum ("valley") value. At yet higher applied voltages, the current again increases with increasing applied voltage. Thus, the current-vs.-voltage characteristic is shaped like the letter "N". A key figure of merit for NDR devices is the ratio of the peak current to the valley current (PVCR). The higher the value of the PVCR, the more useful the NDR device is for variety of circuit applications. The PVCR of RTDs is generally not high enough to make it practical for low-power SRAM application, because in order for the RTDs in a Goto cell to have sufficient current drive, the valley current is too large, causing large static power dissipation. In addition, RTDs require specialized fabrication process sequences so that the complexity of an integrated RTD/MOSFET SRAM process would be substantially higher than that of a conventional complementary MOS (CMOS) SRAM process, resulting in higher manufacturing cost.

Accordingly, there exists a significant need for NDR devices with very high (>$10^6$) PVCR which can be easily integrated into a conventional CMOS technology, for compact, low-power, low-cost SRAM.

SUMMARY OF THE INVENTION

An object of the present invention is to provide a static random access memory (SRAM) cell of significantly smaller size as compared to a conventional six-transistor SRAM cell, while retaining the desirable operating characteristics of the conventional SRAM cell without significant increase in manufacturing cost.

For achieving the object, the invention provides a semiconductor device comprising an n-channel insulated-gate field-effect transistor (IGFET) including a gate and source/drain electrodes, and two (preferably n-channel) NDR-FETs each including gate and source/drain electrodes, wherein the IGFET and NDR-FET elements are formed on a common substrate, with one of the source/drain electrodes of the IGFET semiconductor element connected to the source electrode of a first NDR-FET and also to the drain electrode of a second NDR-FET, the gate electrode of the IGFET connected to a first control terminal, the other one of the source/drain electrodes of the IGFET connected to a second control terminal, the drain electrode of the first NDR-FET connected to a power-supply terminal, the source electrode of the second NDR-FET connected to a grounded or negatively-biased terminal, and the gate electrodes of the NDR-FETs each biased at a constant voltage. Thus, among plural intersections between the I-V characteristic of the first NDR-FET and the I-V characteristic of the second NDR-FET, an intersection at which the gradients (obtained as a change in current in accordance with a change of the control terminal voltage) of the characteristics have different signs (positive, negative, or zero) is a stable operating point of the semiconductor device. Therefore, the semiconductor device can function as a bistable memory cell, with access to the data storage node provided via the IGFET.

DETAILED DESCRIPTION OF THE INVENTION

Figure 1:
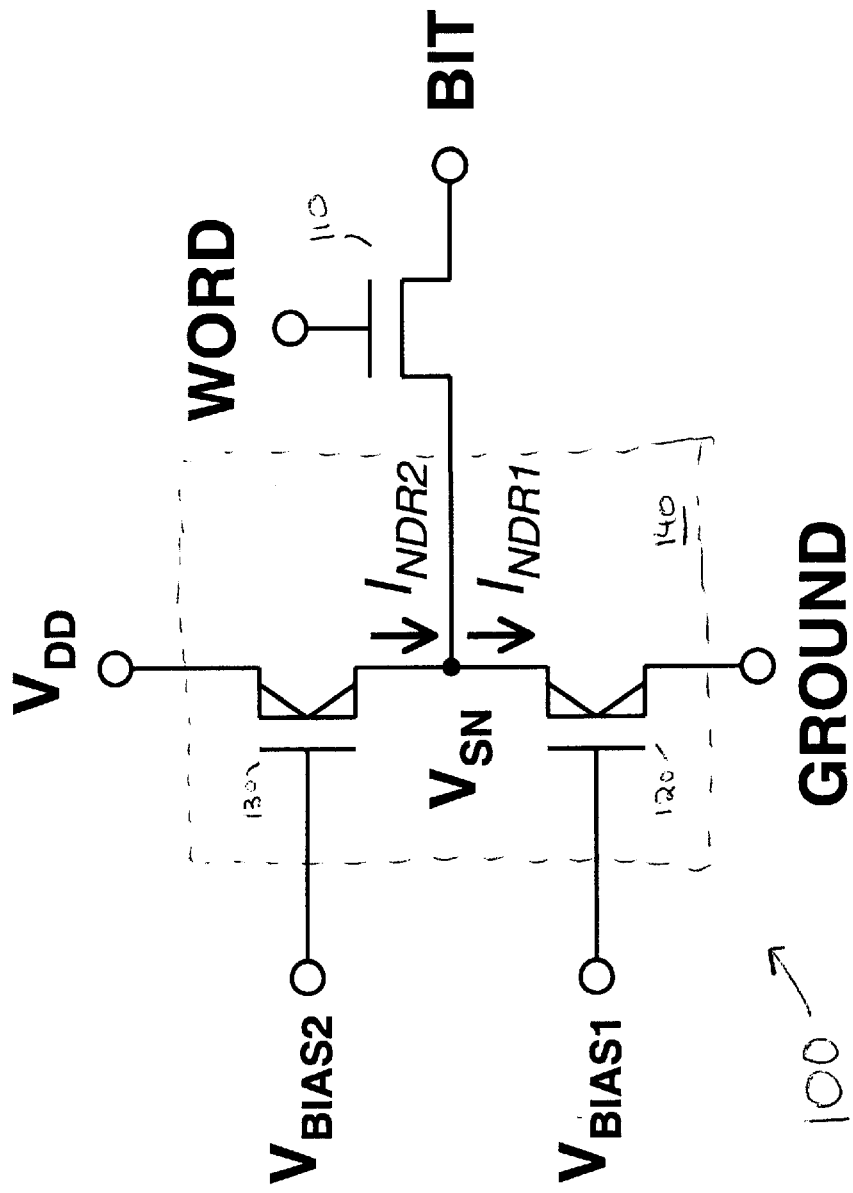
FIG. 1 is a circuit diagram of a static random access memory (SRAM) cell consisting of the combination of two NDR-FET elements which form a bistable latch and one n-channel enhancement-mode IGFET access element.
Figure 2:
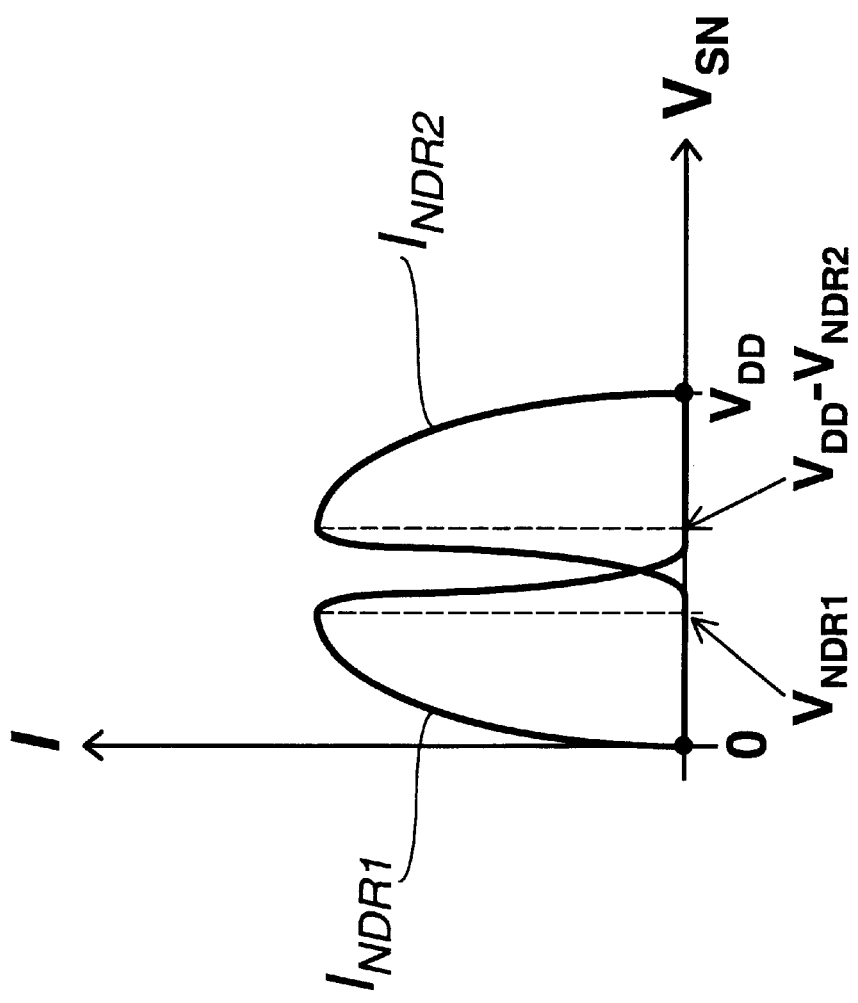
FIG. 2 is a plot of the current-vs.-voltage characteristic of the bistable latch formed by the combination of two NDR-FETs as shown in FIG. 1.

A semiconductor device according a preferred embodiment of the invention will now be described with reference to FIGS. 1 and 2. FIG. 1 is a circuit diagram of a preferred embodiment of a static memory (SRAM) cell 100 consisting of two NDR-FET elements 120, 130 which form a bistable latch 140 and one enhancement-mode IGFET access element 110. FIG. 2 is a current-vs.-voltage plot illustrating the operational characteristics of the static memory cell of FIG. 1. The NDR FET element of the present invention is preferably of the type disclosed in the following King et al. applications: Ser. No. 09/603,101 entitled "A CMOS-PROCESS COMPATIBLE, TUNABLE NDR (NEGATIVE DIFFERENTIAL RESISTANCE) DEVICE AND METHOD OF OPERATING SAME" now U.S. Pat. No. 6,512,274 issued Jan. 28, 2003; and Ser. No. 09/603,102 entitled "CHARGE TRAPPING DEVICE AND METHOD FOR IMPLEMENTING A TRANSISTOR HAVING NEGATIVE A NEGATIVE DIFFERENTIAL RESISTANCE MODE" now U.S. Pat. No. 6,479,862 issue Nov. 12, 2002; and Ser. No. 09/602,658 entitled "CMOS COMPATIBLE PROCESS FOR MAKING A TUNABLE NEGATIVE DIFFERENTIAL RESISTANCE (NDR) DEVICE now U.S. Pat. No. 6,596,617 issue Jul. 23, 2003 all of which were filed Jun. 22, 2000 and which are hereby incorporated by reference as if fully set forth herein.

As is shown in FIG. 1, IGFET 110 is configured as a transfer gate, allowing a BIT line terminal to be connected to a storage node under the control of a WORD line terminal. One of the source/drain electrodes of IGFET 110 is connected to the storage node at potential $V_{SN}$, the other source/drain electrode of IGFET 110 is connected to the BIT line, and the gate electrode of IGFET 110 is connected to the WORD line.

The source electrode of first NDR-FET 120 is connected to a ground terminal, the gate electrode of first NDR-FET 120 is supplied with a first bias voltage VBIASI, the drain electrode of the NDR-FET 120 is connected together with the source electrode of a second NDR-FET 130 to the storage node, the gate electrode of second NDR-FET 130 is supplied with a second bias voltage $V_{BIAS2}$ and the drain electrode of second NDR-FET 130 is supplied with a positive voltage $V_{DD}$. The current flowing in the first NDR-FET, $I_{NDR1}$, is dependent on the difference between its drain electrode potential and its source electrode potential, $V_{SN}$, at first increasing rapidly as $V_{SN}$ increases, reaching a peak value when $V_{SN}$ is equal to a critical voltage $V_{NDR1}$, and rapidly decreasing to nearly zero as $V_{SN}$ increases beyond the critical voltage $V_{NDR1}$. The bias voltage $V_{BIAS1}$ is sufficiently high so as to ensure that first NDR-FET 120 is turned on for values of $V_{SN}$ ranging from 0 V (ground potential) to $V_{NDR1}$. The current flowing in the second NDR-FET, $I_{NDR2}$, is dependent on the difference between its drain electrode potential and its source electrode potential, $V_{DD}-V_{SN}$, at first increasing rapidly as $V_{DD}-V_{SN}$ increases, reaching a peak value when $V_{DD}-V_{SN}$ is equal to a critical voltage $V_{NDR2}$, and rapidly decreasing to nearly zero as $V_{DD}-V_{SN}$ increases beyond the critical voltage $V_{NDR2}$. The bias voltage $V_{BIAS2}$ is sufficiently high so as to ensure that second NDR-FET 130 is turned on for values of $V_{DD}-V_{SN}$ ranging from 0 V (ground potential) to $V_{NDR2}$.

Next the preferred operation of bistable latch 140 in SRAM cell 150 of FIG. 1 will be described. FIG. 2 shows the current-vs.-voltage (I-V) characteristic curve $I_{NDR1}$ of first NDR-FET 120 obtained by changing the storage node voltage $V_{SN}$ in a range between 0 and $V_{DD}$, superimposed with the I-V characteristic curve $I_{NDR1}$ ofsecond NDR-FET 130. A stable operating point of circuit 140 is a point where the I-V characteristic curve $I_{NDR1}$ of the first NDR-FET crosses the I-V characteristic curve $I_{NDR1}$ of the second NDR-FET and additionally the characteristic curves $I_{NDR1}$ and $I_{NDR2}$ have different gradient signs (positive, negative, or zero). (A crossing point where both of the characteristic curves $I_{NDR1}$ and $I_{NDR2}$ have positive or negative gradient is not a stable operating point.)

Therefore it is understood that circuit 140 is stable when the potential $V_{SN}$ at the storage node is one of two values 0 and $V_{DD}$ as shown in FIG. 2. Accordingly, the circuit can be used as a bistable memory cell by applying a potential of one of the two values 0 and $V_{DD}$ to the control terminal as a write voltage. If the value of $V_{SN}$ increases slightly above that of a stable operating point, current $I_{NDR1}$ flowing in first NDR-FET 120 becomes higher than the current $I_{NDR2}$ flowing in second NDR-FET 130, causing the value of $V_{SN}$ to be decreased toward 0 V (ground potential), to restore it to that of the stable operating point. Thus first NDR-FET 120 serves as a "pull-down" device. If the value of $V_{SN}$ falls slightly below that of a stable operating point, the current $I_{NDR2}$ flowing in second NDR-FET 130 becomes higher than the current $I_{NDR1}$ flowing in first NDR-FET 120, causing the value of $V_{SN}$ to be increased toward $V_{DD}$, to restore it to that of the stable operating point. Thus second NDR-FET 130 serves as a "pull-up" device.

IGFET 110 is controlled by the WORD line as follows: when the WORD line potential is sufficiently high, IGFET 110 is turned on, connecting the BIT line to the storage node to allow data transfer (reading data from the storage node, or writing data to the storage node); when the WORD line potential is low, IGFET 110 is turned off, so that the storage node is electrically isolated from the BIT line. In this manner, a bistable latch 140 is realized with two series-connected NDR-FET elements, and a compact static memory cell is obtained by integrating latch 140 with a IGFET pass transistor 110.

It should be noted that in order to achieve low standby current in the SRAM cell, the valley currents of the NDR-FETs are preferably minimized, while in order to achieve a fast read access time, the peak current of the NDR-FETs are preferably maximized. Since the NDR-FET peak current and valley current are controlled by the gate bias voltage applied to the NDR FETs, it is possible to achieve a very low valley current by using a lower gate bias voltage when the SRAM cell is in storage mode to achieve low static power dissipation, and to achieve a very high peak current by using a higher gate bias voltage when the SRAM cell is in read mode to achieve fast access time. In this aspect, the NDR-FET PVCR can effectively be enhanced by several orders of magnitude.

As previously stated, the bias voltage VBIAS2 should be sufficiently high so as to ensure that second (pull-up) NDR-FET 130 is turned on for values of $V_{DD}-V_{SN}$ ranging from 0 V (ground potential) to $V_{NDR1}$. Accordingly, $V_{BIAS2}$ should be greater than or equal to $V_{DD}+V_T$, where $V_T$ is the threshold voltage of second NDR-FET 130. If second NDR-FET 130 is substantially an enhancement-mode device (i.e. $V_T>0$ V), then $V_{BIAS2}$ should be greater than $V_{DD}$. Thus, a separate power supply voltage or a boosted supply (such as that provided by a charge pump circuit) would be needed. It should be noted that the charge pump circuit would not consume much power, as it would only supply a high voltage, with negligible current.

As previously stated, the bias voltage $V_{BIAS1}$ should be sufficiently high so as to ensure that first (pull-down) NDR-FET 120 is turned on for values of $V_{SN}$ ranging from 0 V (ground potential) to $V_{NDR1}$. Therefore, $V_{BIAS1}$ can be tied or coupled to $V_{DD}$ if desired to simplify the present architecture and/or to reduce constraints on the aforementioned charge pump circuit.

Figure 3:
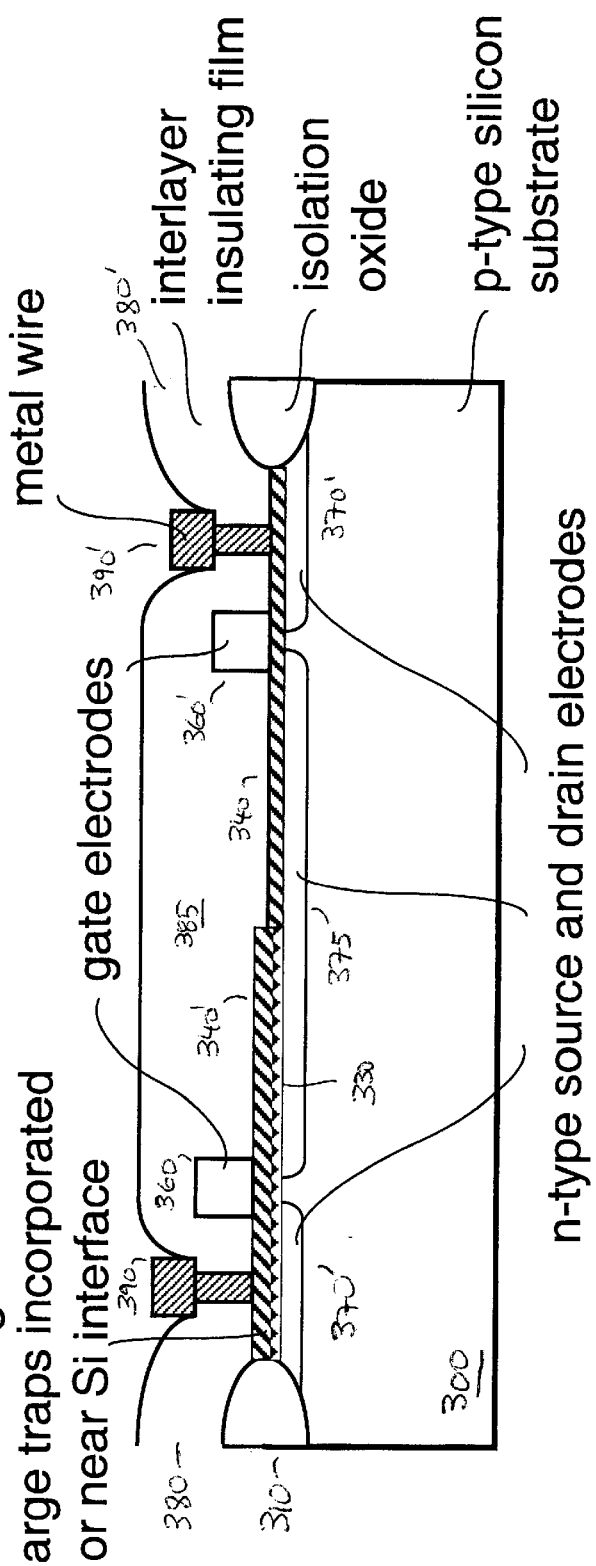
FIG. 3 is a schematic cross-sectional view of an NDR-FET element connected to an IGFET, showing the various layers shared by the two elements which are co-fabricated using a single process flow.

FIG. 3 is a schematic cross-sectional view of an NDR-FET element connected to an IGFET, such as would exist in the preferred embodiment. The NDR-FET and IGFET are formed to include and share many common layers, including at least a portion of the gate insulating film, gate film, interlayer insulator and metal, and hence can be readily fabricated together on a single substrate using a single process flow. For example, a common substrate 300, a common isolation area 310 and common interlayer insulation layers 380 (380') are used by NDR FETs and IGFETs respectively. Furthermore, a single gate electrode layer is use for gates 360, 360' and a single metal/contact layer 390, 390'. Source/drain regions 370, 370' are formed at the same time, and a common source/drain region 375 is shared by the NDR FET and IGFET. This latter region can operate as a storage node for example in the above embodiments. An NDR charge trapping layer 330 is included only within an NDR FET region, for the reasons set forth in the aforementioned referenced applications. Finally, both devices can also share a gate insulation film 340, 340' in some implementations.

While the invention has been described with reference to illustrative embodiments, this description is not intended to be construed in a limiting sense. It will be clearly understood by those skilled in the art that foregoing description is merely by way of example and is not a limitation on the scope of the invention, which may be utilized in many types of integrated circuits made with conventional processing technologies. Various modifications and combinations of the illustrative embodiments, as well as other embodiments of the invention, will be apparent to persons skilled in the art upon reference to the description. Such modifications and combinations, of course, may use other features that are already known in lieu of or in addition to what is disclosed herein. It is therefore intended that the appended claims encompass any such modifications or embodiments. While such claims have been formulated based on the particular embodiments described herein, it should be apparent the scope of the disclosure herein also applies to any novel and non-obvious feature (or combination thereof disclosed explicitly or implicitly to one of skill in the art, regardless of whether such relates to the claims as provided below, and whether or not it solves and/or mitigates all of the same technical problems described above. Finally, the applicants further reserve the right to pursue new and/or additional claims directed to any such novel and non-obvious features during the prosecution of the present application (and/or any related applications).

What is claimed is:

1. A memory cell comprising:

a transfer field effect transistor (FET), said transfer FET being configured to receive and/or transfer a data value from a data line to a storage node in response to a write and/or read signal respectively provided to the memory cell; and a first negative differential resistance (NDR) FET, said first NDR FET being configured to receive a first gate bias signal and having a first NDR FET source terminal coupled to said storage node, and a first NDR FET drain terminal coupled to a first voltage potential at a first node; and a second negative differential resistance (NDR) FET, said second NDR FET being configured to receive a second gate bias signal and having a second NDR FET drain terminal coupled to said storage node, and a second NDR FET drain terminal coupled to a second voltage potential at a second node; and wherein the memory cell uses said negative differential resistance characteristic of said first NDR FET and said second NDR FET to store said data value at said storage node.

2. The memory cell of claim 1, wherein said first NDR FET and said second NDR FET are connected in series.

3. The memory cell of claim 1, wherein said first bias voltage is coupled to said first voltage potential.

4. The memory cell of claim 1, wherein said first NDR FET, said second NDR FET and said transfer FET use a common substrate and one or more common layers.

5. The memory cell of claim 1, wherein said first bias voltage and said second bias voltage are approximately equal.

6. The memory cell of claim 1, wherein said first bias voltage is substantially greater than said second bias voltage.

7. The memory cell of claim 1, wherein said first bias voltage and said second bias voltage are generated by a charge pump circuit.

8. The memory cell of claim 4, wherein said common substrate is a silicon on insulator (SOI) substrate.

9. The memory cell of claim 1, wherein said storage node includes a source/drain region shared by said transfer FET and at least one of said first NDR FET and/or said second NDR FET.

10. The memory cell of claim 1, wherein at least one of said first NDR FET and second NDR FET use a charge trapping region that is located at an interface between a gate insulation layer and a substrate.

11. The memory cell of claim 1, wherein at least one of said first NDR FET and second NDR FET use a charge trapping region that is located within a gate dielectric forming part of a gate insulation layer.

12. A method of operating a memory cell having a storage node comprising the steps of:

receiving or transferring a data value from a data line by gating a transfer field effect transistor (FET) in response to a write or read signal; and biasing a first negative differential resistance capable FET (first NDR FET) with a first bias signal so that said first NDR FET selectively operates with a first negative differential resistance (NDR) characteristic; and biasing a second negative differential resistance capable FET (second NDR FET) with a second bias signal so that said second NDR FET to operate with a first negative differential resistance (NDR) characteristic; and coupling said first NDR FET and said second NDR FET in a latched configuration with said transfer FET so that said data value can be read or written to the storage node in cooperation with said transfer FET; and operating said first NDR FET and said second NDR FET with said first NDR characteristic and said second NDR characteristic so that said data value is stored at said storage node.

13. The method of claim 12, wherein at least one of said first NDR FET and said second NDR FET do not operate with an NDR characteristic during an initial period of a read or write operation.

14. The method of claim 13, wherein at least one of said first NDR FET and said second NDR FET operate with an NDR characteristic during a final period of a read or write operation so that said at least one of said first NDR FET and said second NDR FET turns off at the end of said final period.

15. The method of claim 12, wherein said first bias signal and said second signal are selectively enabled depending on an operation performed by the memory cell.

16. The method of claim 12, wherein said first bias signal and said second signal differ by an amount equal to a threshold voltage.

* * * * *